(12) United States Patent
Yun et al.

(10) Patent No.: US 8,213,251 B2
(45) Date of Patent: Jul. 3, 2012

(54) SEMICONDUCTOR MEMORY DEVICE AND METHOD FOR DRIVING THE SAME

(75) Inventors: Tae-Sik Yun, Gyeonggi-do (KR); Kang-Seol Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 181 days.

(21) Appl. No.: 12/829,987

(22) Filed: Jul. 2, 2010

(65) Prior Publication Data

US 2011/0158023 A1    Jun. 30, 2011

(30) Foreign Application Priority Data

Dec. 30, 2009    (KR) .................. 10-2009-0134566

(51) Int. Cl.
*G11C 7/02*    (2006.01)
(52) U.S. Cl. .................. 365/207; 365/189.11
(58) Field of Classification Search .................. 365/207, 365/205, 189.11
See application file for complete search history.

(56) References Cited

U.S. PATENT DOCUMENTS

| 5,267,214 | A  | * | 11/1993 | Fujishima et al. | ........ 365/230.03 |
| 7,561,462 | B2 | * | 7/2009  | Hsu              | .............. 365/149 |
| 7,652,941 | B2 | * | 1/2010  | Mori et al.      | ................. 365/203 |
| 7,929,367 | B2 | * | 4/2011  | Yoo et al.       | ................. 365/222 |

FOREIGN PATENT DOCUMENTS

KR    1019900019040    12/1990
KR    1020070084785    8/2007

OTHER PUBLICATIONS

Notice of Allowance issued from Korean Intellectual Property Office on Apr. 30, 2011.

* cited by examiner

*Primary Examiner* — Anh Phung
(74) *Attorney, Agent, or Firm* — IP & T Group LLP (57) ABSTRACT

A semiconductor memory device includes a cell block including a first bit line, a sense amplifier unit including a second bit line and configured to amplify a data signal applied to the second bit line, a connection unit configured to selectively connect the first bit line and the second bit line, a connection control unit configured to receive a control signal for driving the sense amplifier unit and a selection signal for selecting the cell block and generate a connection signal for activating the connection unit at a first time, and a sense amplifier driving control unit configured to receive the control signal and generate a sense amplifier driving signal for driving the sense amplifier unit at a second time after the first time.

12 Claims, 12 Drawing Sheets

SEMICONDUCTOR MEMORY DEVICE AND METHOD FOR DRIVING THE SAME

CROSS-REFERENCE TO RELATED APPLICATIONS

The present application claims priority of Korean Patent Application No. 10-2009-0134566, filed on Dec. 30, 2009, which is incorporated herein by reference in its entirety.

BACKGROUND OF THE INVENTION

Exemplary embodiments of the present invention relate to a semiconductor integrated circuit, and more particularly, to a semiconductor memory device and a driving method thereof.

A dynamic random access memory (DRAM), which is widely used among memory devices, stores data into a unit cell including one transistor and one capacitor. In order to store a larger amount of data in a semiconductor memory device, a larger number of cells are integrated in the semiconductor memory device. Cells of a memory device may be designed and fabricated in the smallest size within the bounds of related technologies.

Accordingly, a data signal stored in a memory cell may be so weak that it may not be directly outputted to the outside of the memory device. Therefore, semiconductor memory devices may include an amplification circuit configured to amplify a data signal stored in a memory cell. In general, the amplification circuit provided in semiconductor memory devices is referred to as a sense amplifier. Semiconductor memory devices include at least two-stage sense amplifiers to sufficiently amplify a data signal such that the data signal may be stably outputted to the outside of the semiconductor memory devices.

To reduce the number of sense amplifiers provided in the semiconductor memory devices, one sense amplifier is commonly disposed in neighboring cell blocks and a selected cell block of the neighboring cell blocks may be connected to the sense amplifier. In order to accomplish this, a switch connecting the sense amplifier and the cell blocks is provided. Furthermore, there is demand for a control circuit controlling the switch.

Meanwhile, a low-level voltage is used as a driving voltage to reduce power consumption in semiconductor memory devices. Accordingly, it may take a relatively large amount of time for the sense amplifier to sense and amplify a data signal using the low-level voltage. To address this concern, a technique which provides a relatively high-level voltage as the driving voltage at the moment the sense amplifier senses a data signal may be applied to drive semiconductor memory devices. This is referred to as an overdriving of the semiconductor memory device.

The effectiveness of the sense amplifier in amplifying the data signal is influential in the operation characteristics of semiconductor memory devices. Therefore, it is desired to effectively drive the sense amplifier.

SUMMARY OF THE INVENTION

Exemplary embodiments of the present invention are directed to a semiconductor memory device capable of improving a sensing margin characteristic of a sense amplifier.

In accordance with an exemplary embodiment of the present invention, a semiconductor memory device includes a cell block including a first bit line, a sense amplifier unit including a second bit line and configured to amplify a data signal applied to the second bit line, a connection unit configured to selectively connect the first bit line and the second bit line, a connection control unit configured to receive a control signal for driving the sense amplifier unit and a selection signal for selecting the cell block and generate a connection signal for activating the connection unit at a first time, and a sense amplifier driving control unit configured to receive the control signal and generate a sense amplifier driving signal for driving the sense amplifier unit at a second time after the first time.

In accordance with another exemplary embodiment of the present invention, a method for driving a semiconductor memory device, comprising a cell block comprising a first bit line, and a sense amplifier unit comprising a second bit line and configured to amplify a data signal applied to the second bit line, comprises selectively connecting the first bit line and the second bit line in response to a control signal for driving the sense amplifier unit and a selection signal for selecting the cell block at a first time, and generating a sense amplifier driving signal for driving the sense amplifier unit in response to the control signal at a second time after the first time.

In accordance with further exemplary embodiment of the present invention, a semiconductor memory device includes a cell block having a first bit line and configured to store a data signal, a sense amplifying unit having a second bit line and configured to amplify the data signal in response to a driving signal, a connection unit configured to selectively connect the first bit line and the second bit line in response to a connection signal, a sense amplifying unit controller configured to generate the driving signal in response to a sense amplifying unit control signal, and a connection unit controller configured to generate the connection signal in response to the sense amplifying unit control signal and a selection signal for selecting the cell block, wherein the connection signal is synchronized with the driving signal.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Exemplary embodiments of the present invention provide a method for increasing a delta V which is a voltage difference between a bit line and a bit bar line, when a semiconductor memory device senses cell data. Specifically, a connection transistor for separating or connecting a sense amplifier from or to a cell block is controlled to improve a sensing margin characteristic of the semiconductor memory device.

Figure 1:
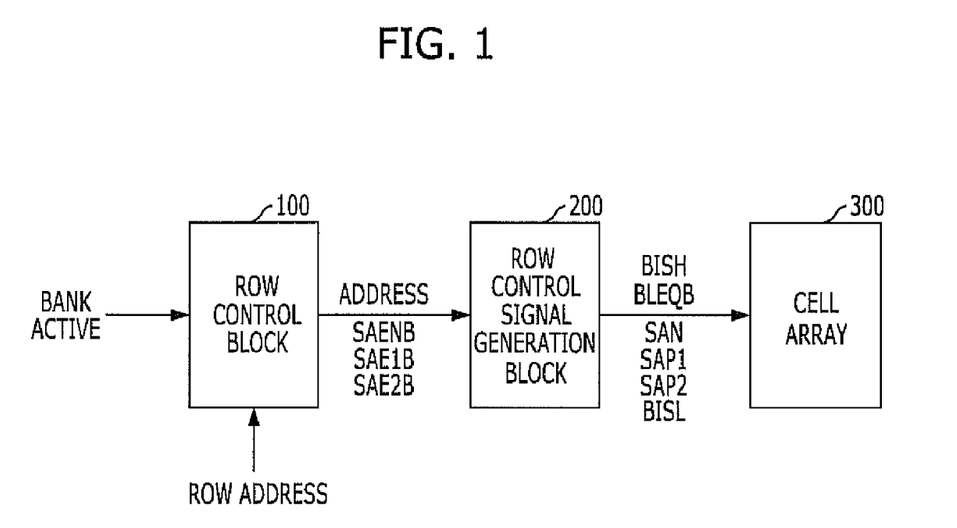
FIG. 1 is a block diagram of a semiconductor memory device in accordance with an exemplary embodiment of the present invention.

FIG. 1 is a block diagram of a semiconductor memory device in accordance with an exemplary embodiment of the present invention.

Referring to FIG. 1, the semiconductor memory device includes a row control block 100, a row control signal generation block 200, and a cell array 300.

When a semiconductor memory device is in an active state, the row control block 100 receives and decodes a bank active signal BANK ACTIVE and a row address ROW ADDRESS to select a memory cell in the cell array 300. The cell array 300 includes a plurality of memory cells arranged in a matrix form including rows and lines, and the memory cells arranged in a matrix form are grouped for each cell block. Therefore, the row control block 100 outputs a decoded address ADDRESS such that a cell block is selected and one row in the selected cell block is selected in correspondence to the inputted row address. Furthermore, the row control block 100 outputs sense amplifier control signals SAENE, SAE1B, and SAE2B.

The row control signal generation block 200 is configured to receive the decoded address ADDRESS and the sense amplifier control signals SAENE, SAE1B, and SAE2B, and output connection signals BISH and BISL, sense amplifier driving signals SAN, SAP1, and SAP2, and an equalizing control signal BLEQB. In FIG. 1, the connection signals BISH and BISL, the sense amplifier driving signals SAN, SAP1, and SAP2, and the equalizing control signal BLEQB are represented as one signal. Although FIG. 1 shows only this one signal, a number of signals corresponding to the number of cell blocks may be outputted.

The connection signals BISH and BISL are used for connecting or separating a cell block to or from a bit line sense amplifier. To effectively use a circuit area, the bit line sense amplifier is commonly used by two neighboring cell blocks, and the connection signals BISH and BISL control a connection transistor to connect the bit line sense amplifier to one of the neighboring cell blocks.

Figure 2:
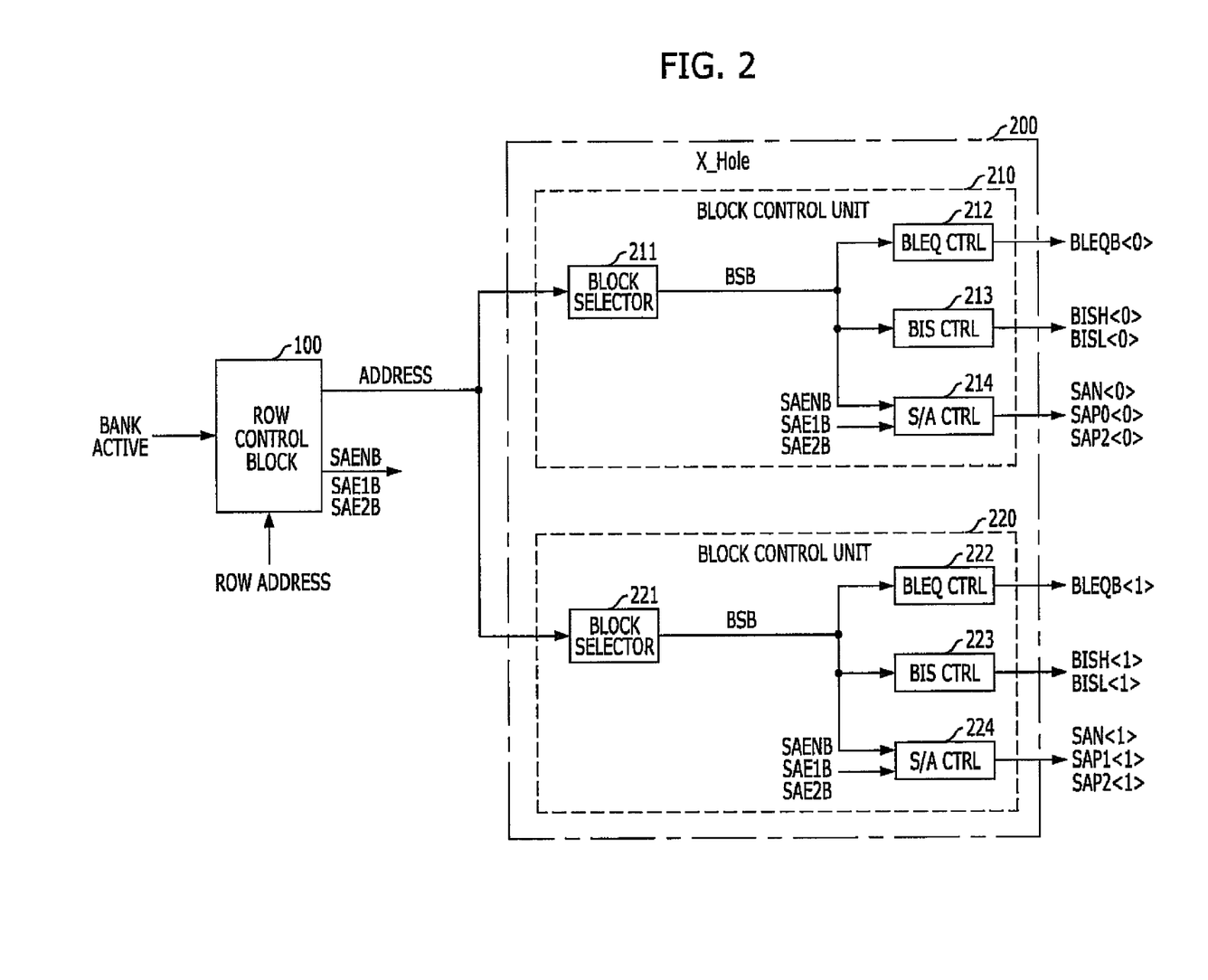
FIG. 2 is a block diagram illustrating a row control block and a row control signal generation block of FIG. 1.

FIG. 2 is a block diagram illustrating the row control block 100 and the row control signal generation block 200 of FIG. 1.

Referring to FIG. 2, the row control signal generation block 200 includes block control units 210 and 220. The block control unit 210 includes a block selector 211, an equalizing controller (BLEQ CTRL) 212, a connection controller (BIS CTRL) 213, and a sense amplifier controller (S/A CTRL) 214. The block selector 211 is configured to receive the decoded address ADDRESS and output a block selection signal BSB for selecting a cell block. The equalizing controller 212 is configured to receive the block selection signal BSB and output the equalizing control signal BLEQB. The connection controller 213 is configured to receive the block selection signal BSB and output the connection signals BISH and BISL. The sense amplifier controller 214 is configured to receive the block selection signals BSB and the sense amplifier control signals SAENE, SAE1B, and SAE2B and output the sense amplifier driving signals SAN, SAP1, and SAP2. The block control unit 220 also includes a block selector 221, an equalizing controller 222, a connection controller 223, and a sense amplifier controller 224. The respective components of the block control unit 220 are configured to operate in substantially the same manner as the above-described components of the block control unit 210.

Figure 3:
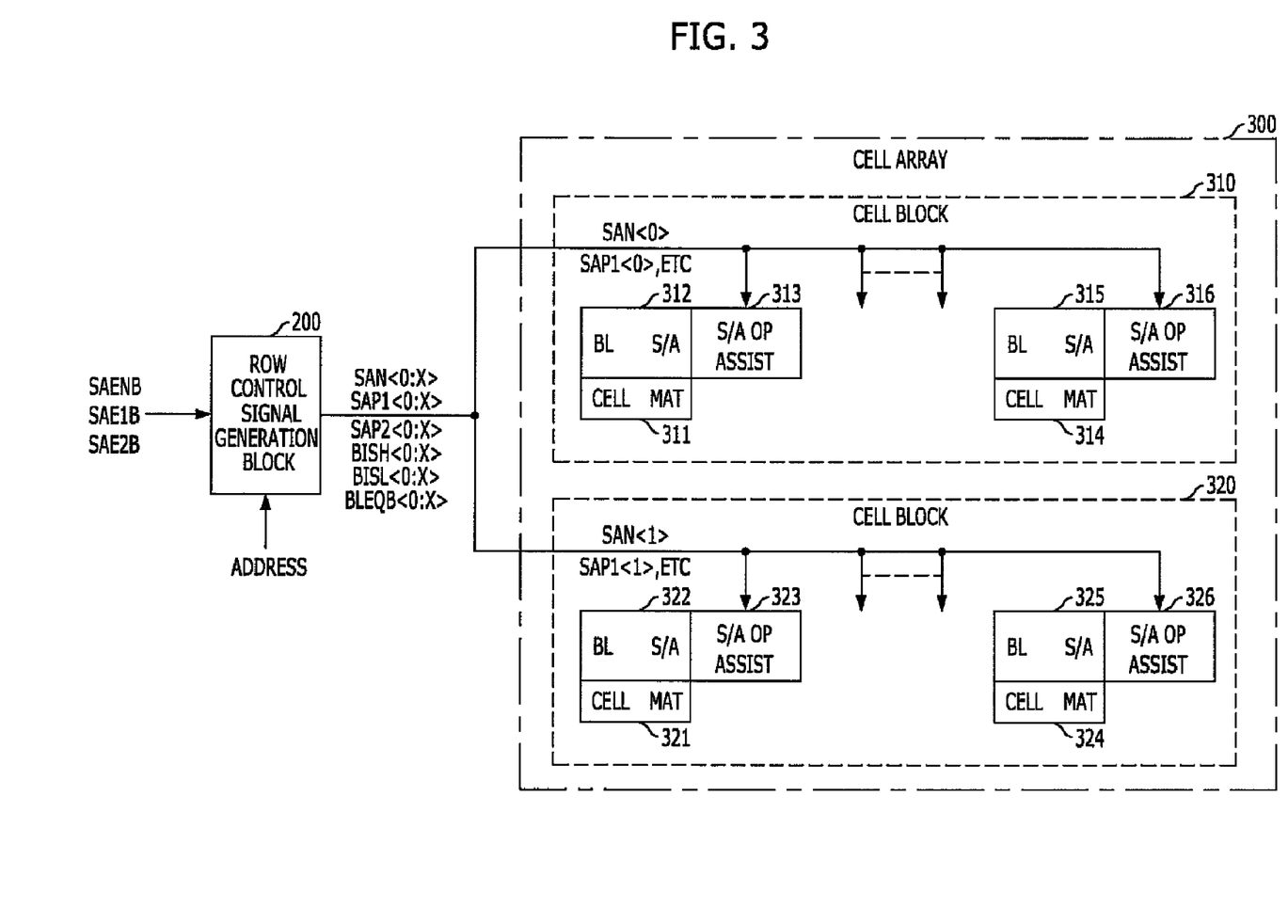
FIG. 3 is a block diagram illustrating a row control signal generation block and a cell array of FIG. 1.

FIG. 3 is a block diagram illustrating the row control signal generation block 200 and the cell array 300 of FIG. 1.

Referring to FIG. 3, the cell array includes a plurality of cell blocks 310 and 320. The cell block 310 includes cell mats 311 and 314, bit line sense amplifier units (BL S/A) 312 and 315, and sense amplifier operation assistance units (S/A OP ASSIST) 313 and 316. The cell block 320 is configured in the same manner as the cell block 310. The cell mats 311 and 314 include a plurality of memory cells arranged in a matrix form, and the bit line sense amplifier units 312 and 315 are configured to amplify bit lines connected to the memory cells. The sense amplifier operation assistance units 313 and 316 are configured to assist the operations of the bit-line sense amplifier units 312 and 315.

FIGS. 4 to 7 are circuit diagrams illustrating the row control signal generation block 200 of FIG. 2.

Figure 4:
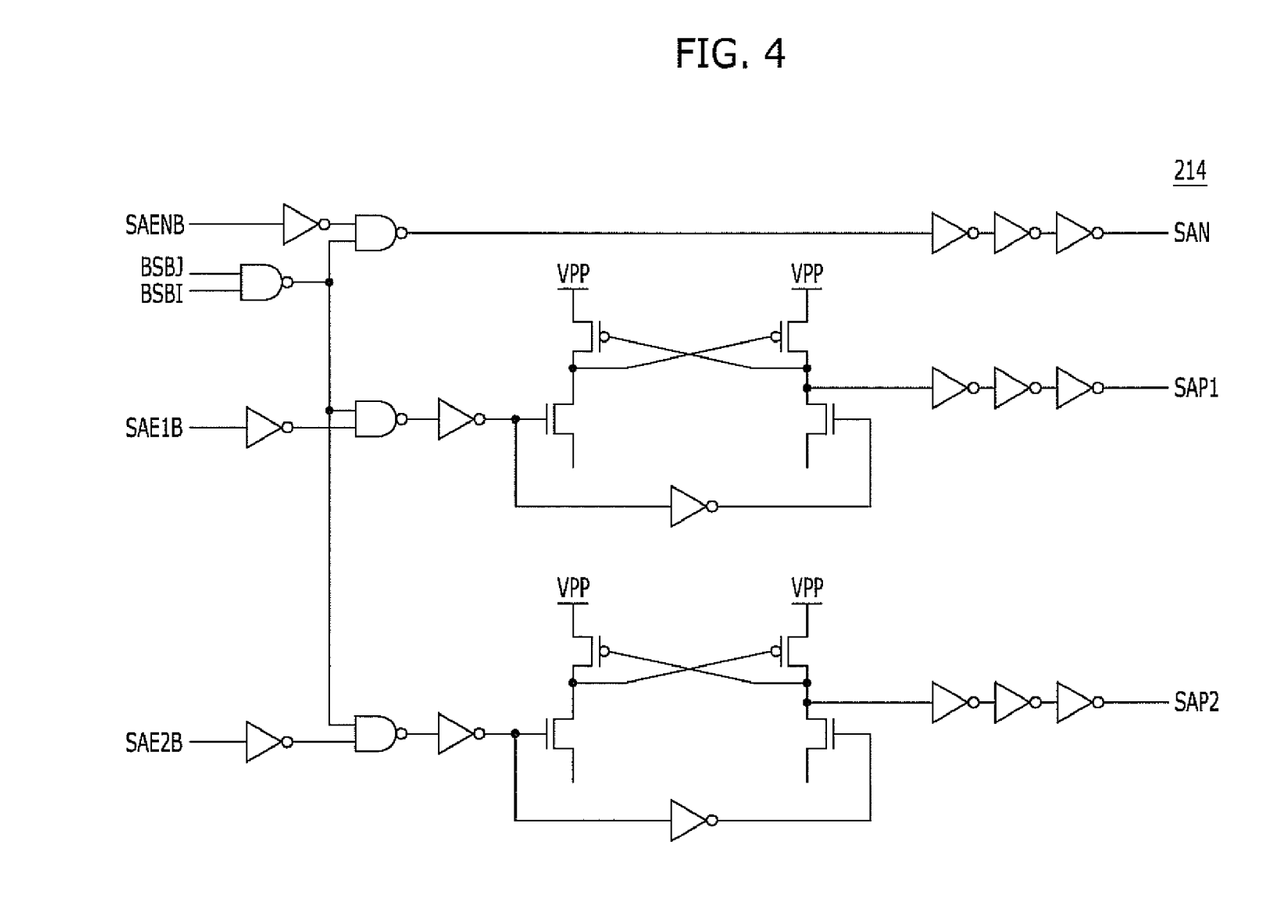
FIGS. 4 to 7 are circuit diagrams illustrating the row control signal generation block of FIG. 2.

FIG. 4 illustrates the sense amplifier controller 214 of FIG. 2.

Referring to FIG. 4, the sense amplifier controller 214 is configured to receive the sense amplifier control signals SAENB, SAE1B, and SAE2B and output the sense amplifier driving signals SAN, SAP1, and SAP2. The sense amplifier driving signals SAN, SAP1, and SAP2 rise up to a level of a high voltage VPP which is higher than a power supply voltage, when activated to a logic high level.

The block selection signals BSBI and BSBJ are signals for connecting a selected cell mat to a bit line sense amplifier unit. The block selection signal BSBI is a control signal for selecting one of neighboring cell mats corresponding to the bit line sense amplifier unit, and the block selection signal BSBJ is a control signal for connecting the other cell mat to the bit line sense amplifier unit. When any one of the block selection signals BSBI and BSBJ has a low level, the sense amplifier control signals SAENE, SAE1B, and SAE2B are transferred to the circuit of FIG. 4 to generate the sense amplifier driving signals SAN, SAP1, and SAP2.

Figure 5:
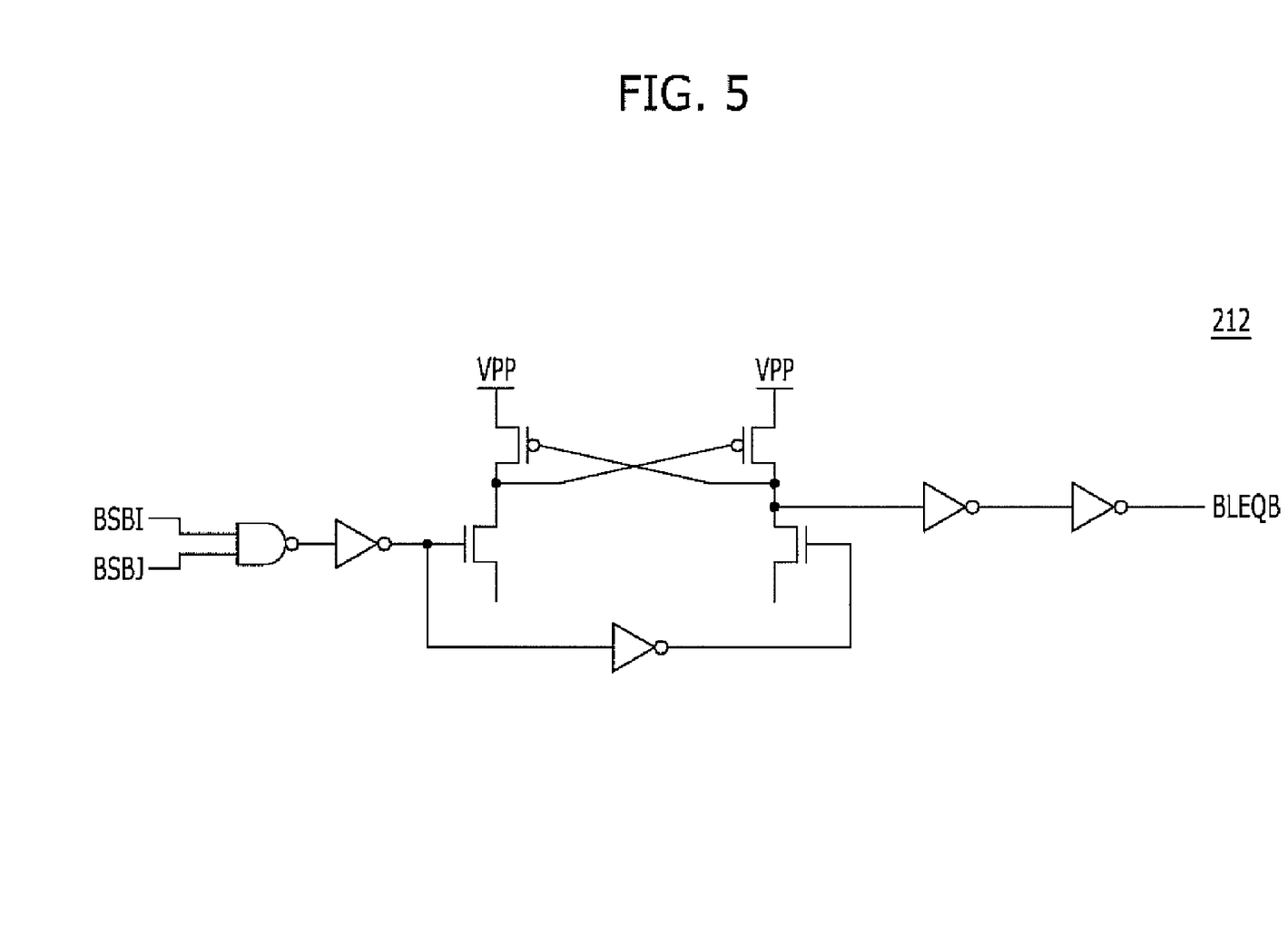

FIG. 5 illustrates the equalizing controller 212 of FIG. 2. When any one of the block selection signals BSBI and BSBJ has a low level, the equalizing control signal BLEQB is outputted as a logic high level signal.

Figure 6:
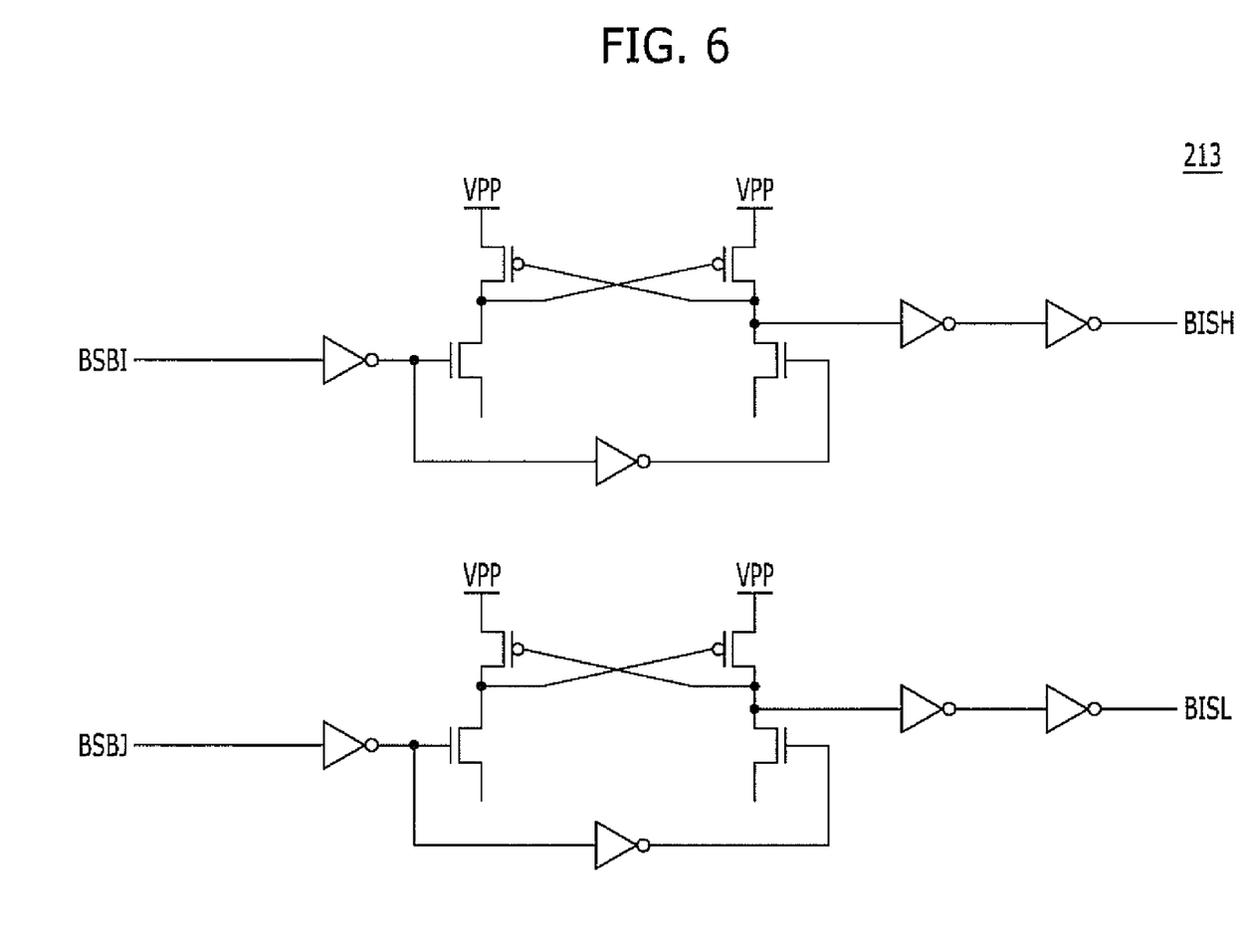

FIG. 6 illustrates the connection controller 213 of FIG. 2.

Referring to FIG. 6, the connection controller 213 is configured to receive the block selection signals BSBI and BSBJ and generate the connection signals BISH and BISL. The connection signals BISH and BISL are signals for controlling a connection transistor. In a precharge state, the connection signals BISH and BISL are outputted to turn on a connection transistor. In an active state, the connection signals BISH and BISL are outputted to turn on a connection transistor to which a unit cell connected to a selected word line is connected.

Figure 7:
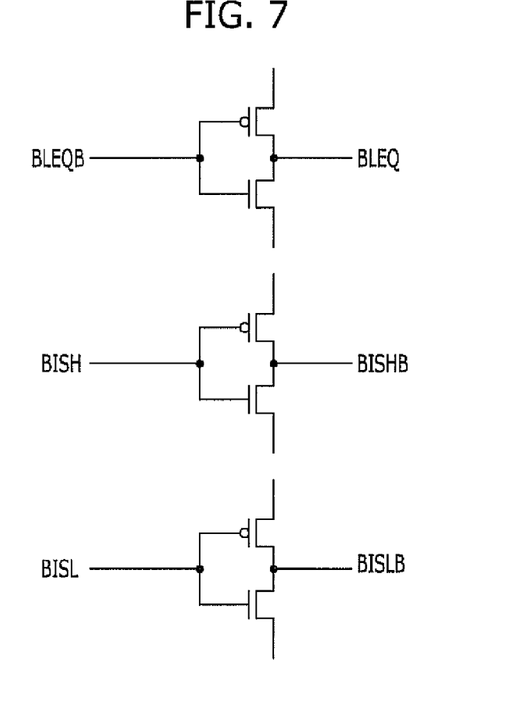

FIG. 7 illustrates repeater circuits which are disposed in paths through which the connection signals BISH and BISL and the equalizing control signal BLEQB are transferred, and configured to amplify the signals. When the paths through which the connection signals BISH and BISL and the equalizing control signal BLEQB are transferred are lengthened inside the semiconductor memory device, the signals may not be transferred stably, and the magnitudes of the signals may be reduced by the resistance of the paths. The repeater circuits are provided to address such concerns.

Figure 8:
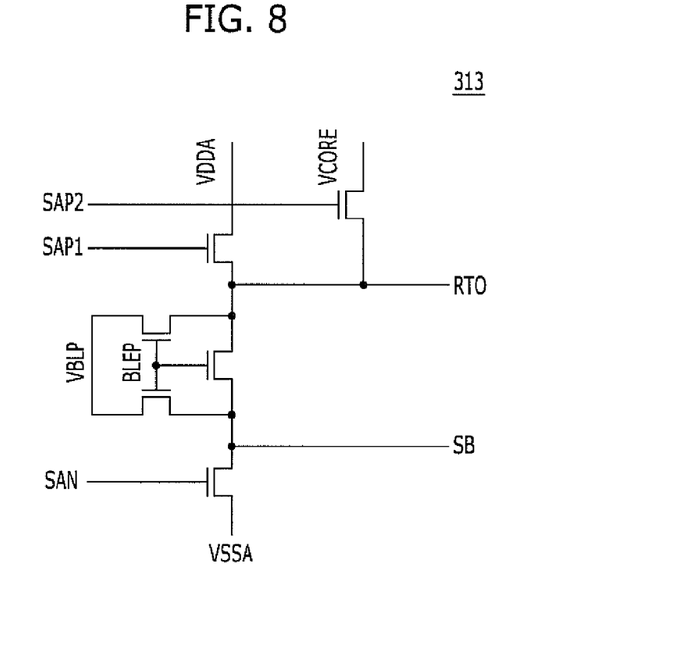
FIGS. 8 and 9 are circuit diagrams illustrating the cell array of FIG. 3.
Figure 9:
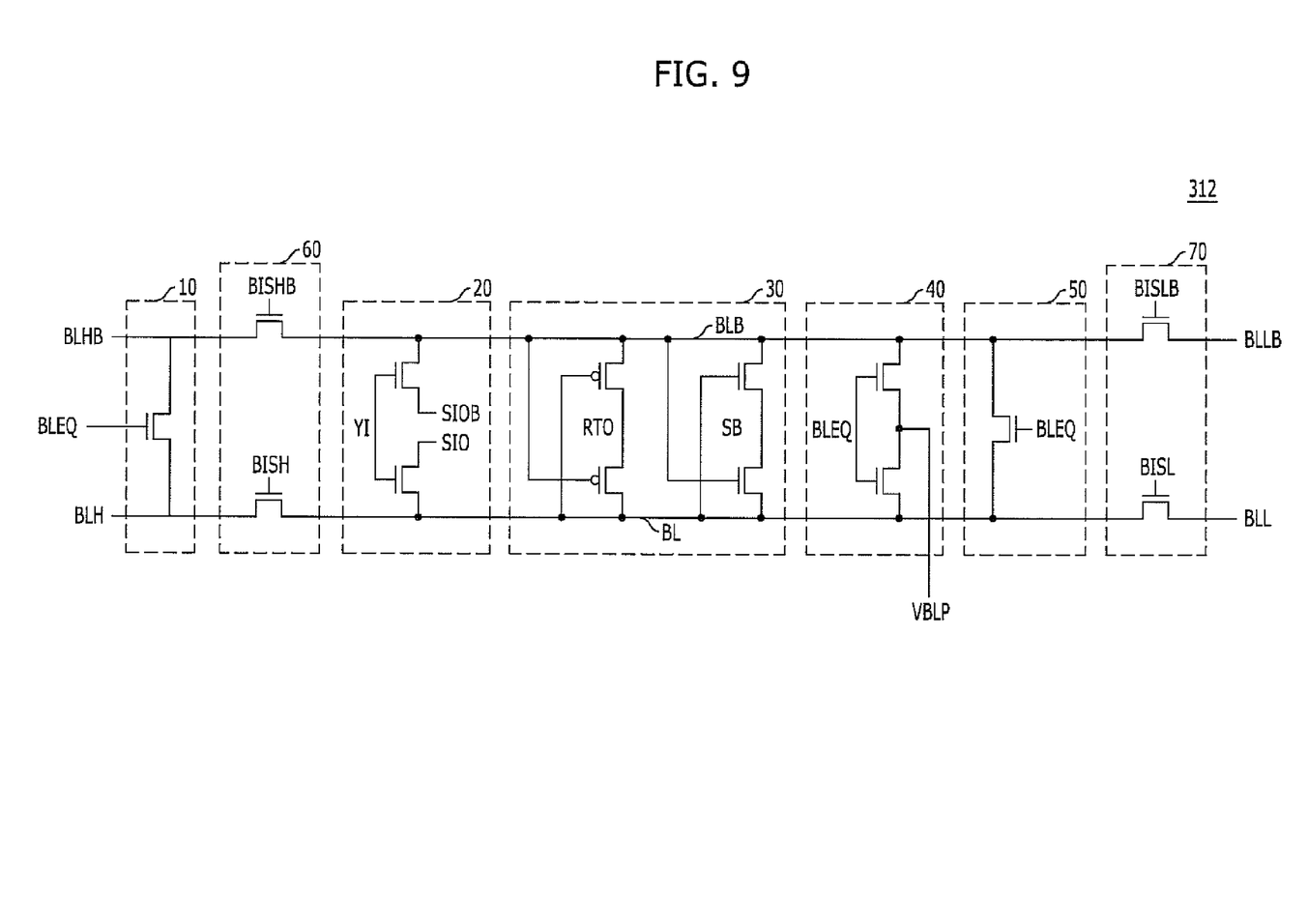

FIGS. 8 and 9 are circuit diagrams illustrating the cell array 300 of FIG. 3.

FIG. 8 illustrates the sense amplifier operation assistance units 313, 316, 323, and 326 shown in FIG. 3. Herein, for sake of convenience only the sense amplifier operation assistance unit 313 is described. The sense amplifier operation assistance unit 313 is configured to receive the sense amplifier driving signals SAN, SAP1, and SAP2 and output first and second sense amplifier voltage signals RTO and SB. The second sense amplifier voltage signal SB is outputted with a ground voltage level VSSA in response to the sense amplifier driving signal SAN. The first sense amplifier voltage signal RTO is outputted with a power supply voltage level VDDA in response to the sense amplifier driving signal SAP1 or a core voltage level VCORE in response to the sense amplifier driving signal SAP2.

FIG. 9 illustrates the bit line sense amplifier units 312, 315, 322, and 325 shown in FIG. 3. Herein, for sake of convenience, only the bit line sense amplifier unit 312 is described. The bit line sense amplifier unit 312 includes equalizing sections 10 and 50, connection sections 60 and 70, a data output section 20, a bit line sense amplifier 30, and an equalizing voltage provision section 40.

The equalizing section 10 is configured to receive the equalizing control signal BLEQ and equalize voltages of bit lines BLHB and BLH. The connection section 60 is configured to connect or separate bit lines BL and BLB to or from the bit lines BLHB and BLH, and includes connection transistors. The data output section 20 is configured to output a signal amplified by the bit line sense amplifier 30 to output lines SIO and SIOB in response to a control signal YI.

The bit line sense amplifier 30 is configured to sense and amplify a difference between two signals applied to the bit lines BL and BLB. The equalizing voltage provision section 40 is configured to provide an equalizing voltage VBLP to the bit lines BL and BLB in response to the equalizing control signal BLEQ.

The equalizing section 50 is configured to receive the equalizing control signal BLEQ and equalize voltages of the bit lines BLB and BL. The connection section 70 is configured to connect or separate the bit lines BL and BLB to or from bit lines BLLB and BLL, and includes connection transistors. The bit lines BLHB and BLH are connected to a memory cell provided in one cell block, and the bit lines BLLB and BLL are connected to a memory cell provided in another cell block.

Referring to FIG. 9, the operation of the bit line sense amplifier unit is described. When the semiconductor memory device is in the active state and the bit line sense amplifier unit 312 is activated, one of the connection sections 60 and 70 is activated, and the other is deactivated. Assuming that the connection section 60 is activated, the bit lines BL and BLB are connected to the bit lines BLH and BLHB, and data of the memory cell connected to the bit lines BLH and BLHB are transferred to the bit lines BL and BLB.

The bit line sense amplifier 30 receives the first and second sense amplifier voltage signals RTO and SB and amplifies the data signal applied to the bit lines BL and BLB. At this time, before the first and second sense amplifier voltage signals RTO and SB are provided to the bit line sense amplifier 30, a sense amplifier power line to which the first and second sense amplifier voltage signals RTO and SB are transferred is in a floating state, so that a current path between neighboring bit line sense amplifiers sharing the sense amplifier power line may be generated. Accordingly, the current path may increase time for the bit line sense amplifier 30 to sense and amplify the data signal applied to the bit lines BL and BLB, and a sensing margin characteristic of the bit line sense amplifier 30 may be degraded.

To remove such a factor that reduces the sensing margin, the embodiment of the present invention provides the memory device which synchronizes the connection signals BISH and BISL, which control the turn-off timing of the connection transistors provided in the connection sections 60 and 70, with the sense amplifier control signals SAENB, SAE1B, and SAE2B. In order to achieve this, the connection controller 213 of FIG. 6 may receive the sense amplifier control signal SAENB as well as the block selection signals BSBI and BSBJ, when generating the connection signals BISH and BISL.

Figure 10:
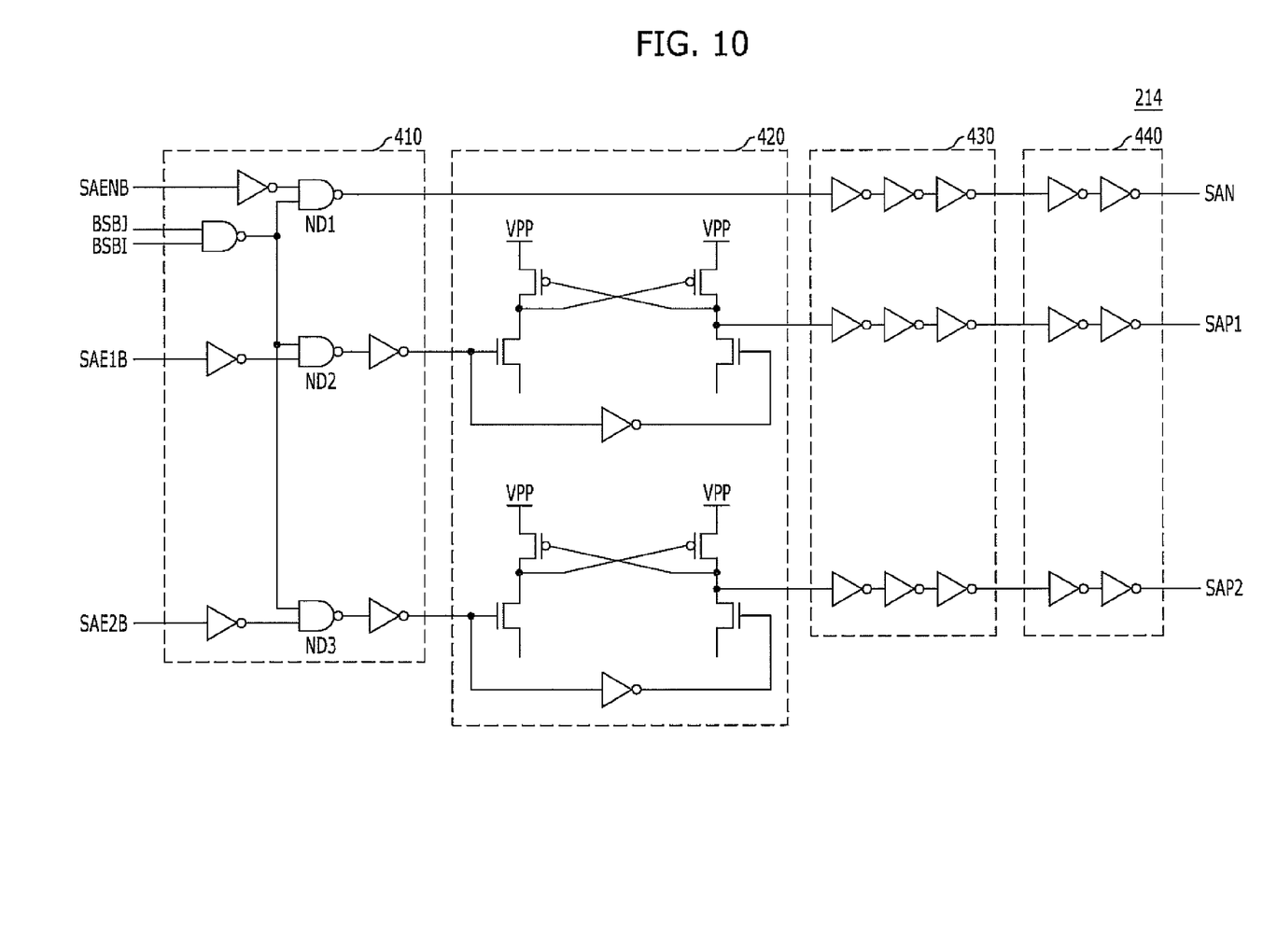
FIGS. 10 and 11 are circuit diagrams of the semiconductor memory device in accordance with another exemplary embodiment of the present invention.
Figure 11:
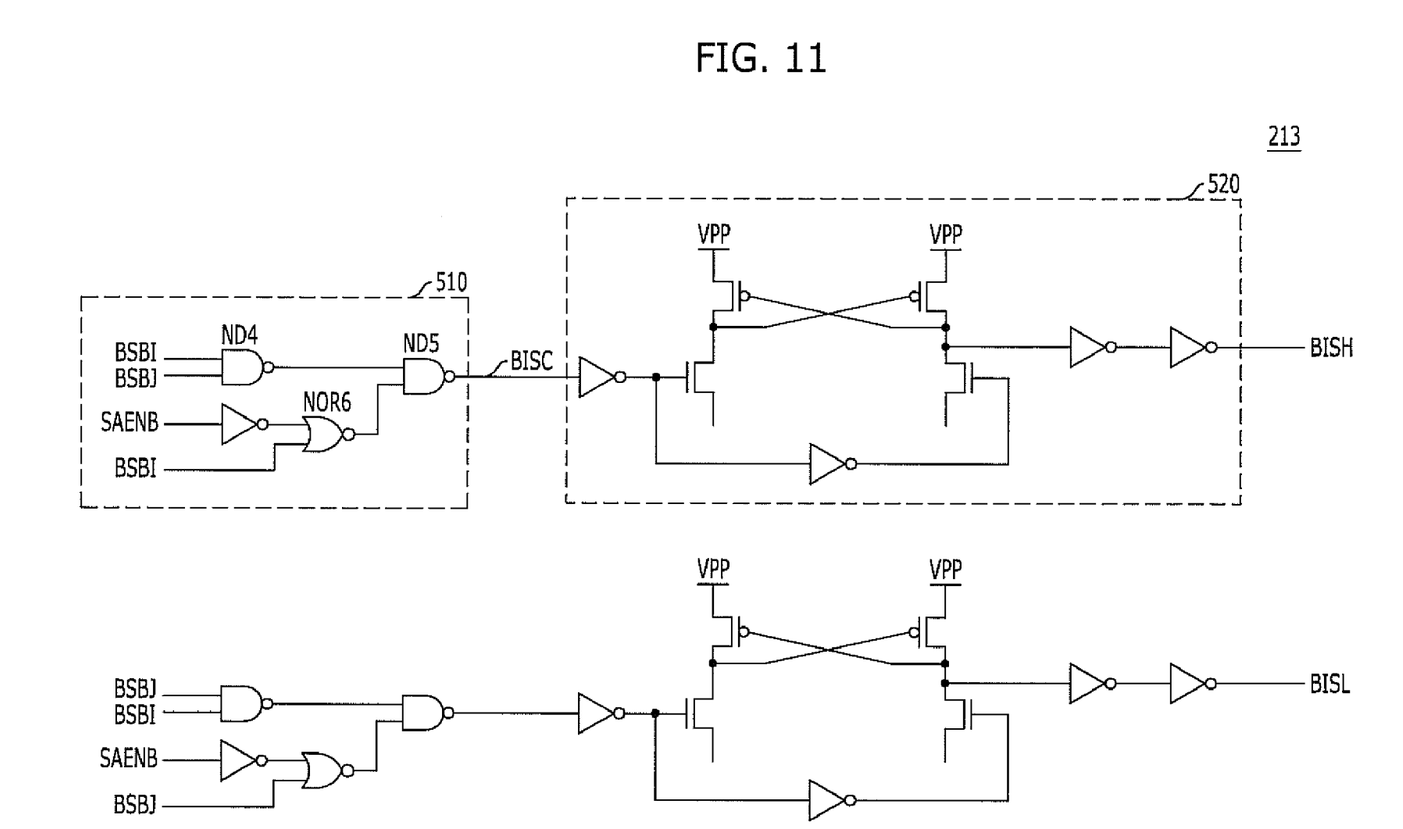

FIGS. 10 and 11 are circuit diagrams of the semiconductor memory device in accordance with another exemplary embodiment of the present invention. FIG. 10 illustrates the sense amplifier controller 214.

Referring to FIG. 10, the sense amplifier controller 214 includes a signal input section 410, a level shifter 420, an output section 430, and a delay transfer section 440. The sense amplifier controller 214 of FIG. 10 operates similarly to that of FIG. 4, but additionally includes the delay transfer section 440 configured to delay the output of the sense amplifier driving signals SAN, SAP1, and SAP2.

The signal input section 410 is configured to receive the block selection signals BSBJ and BSBI and the sense amplifier control signals SAENB, SAE1B, and SAE2B. When any one of the block selection signals BSBJ and BSBI is activated, the sense amplifier control signals SAENB, SAE1B, and SAE2B are transferred through NAND gates ND1 to ND3, respectively. The sense amplifier control signal SAENB passes through the output section 430 and the delay transfer section 440 to be outputted as the sense amplifier driving signal SAN. The level shifter 420 is configured to shift the level of the sense amplifier control signals SAE1B and SAE2B transferred by the NAND gates ND2 and ND3 into the high voltage level VPP.

The output section 430 includes three sets of three inverters connected in series to transfer the sense amplifier control signals SAENB, SAE1B, and SAE2B. The delay transfer section 440 includes three sets of two inverters connected in series such that the sense amplifier control signals SAENB, SAE1B, and SAE2B transferred by the output section 430 may be outputted as the sense amplifier driving signals SAN, SAP1, and SAP2. The delay transfer section 440 includes an even number of inverters to maintain the phase of the signals outputted from the output section 430.

The delay transfer section 440 is configured to delay the timing at which the sense amplifier driving signals SAN, SAP1, and SAP2 are outputted. The delay transfer section 440 delays the timing such that the connection signals BISH and BISL, which are described below, are transferred to the bit line sense amplifier units 312 and 315 before the sense amplifier driving signals SAN, SAP1, and SAP2 are transferred to the bit line sense amplifier units 312 and 315. That is, the delay transfer section 440 may secure an operation margin in which the connection signals BISH and BISL are transferred to the bit line sense amplifier units 312 and 315. Therefore, the leakage current generated when the bit line sense amplifier units 312 and 315 are turned on by the sense amplifier driving signals SAN, SAP1, and SAP2 before the connection signals BISH and BISL are transferred to the bit line sense amplifier units 312 and 315 can be prevented. In FIG. 10, the delay transfer section 440 is implemented with inverters, but may be implemented with other elements.

FIG. 11 illustrates the connection controller 213. The connection controller 213 in accordance with the embodiment of the present invention includes a signal input section 510 and a level shifter 520.

The signal input section 510 includes a NAND gate ND4 configured to receive the block selection signals BSBJ and BSBI, a NOR gate NOR1 configured to receive the sense amplifier control signal SAENB, and a NAND gate ND5 configured to combine the outputs of the NAND gate ND4 and the NOR gate NOR1 to output an output control signal BISC. The level shifter 520 is configured to receive the output control signal BISC outputted from the signal input section 510, shift the level of the output control signal BISC, and output the connection signal BISH. The circuit for outputting the connection signal BISL has the same circuit configuration as the above-discussed circuit for outputting the connection signal BISH. However, the block selection signals BSBJ and BSBI are inputted to the signal input section 510 in different ways.

In the semiconductor memory device in accordance with the exemplary embodiment of the present invention, the connection controller receives the sense amplifier control signal SAENB, and generates a connection signal for connecting the bit lines connected to the bit line sense amplifier to the bit lines connected to the cell array. Therefore, the output timing of the connection signals BISH and BISL from the connection controller may be synchronized with the driving timing of the bit line sense amplifier. Furthermore, the bit lines of the cell array may be connected to the bit lines of the sense amplifier in accordance with the driving timing of the bit line sense amplifier by the sense amplifier controller and the connection controller illustrated in FIGS. 10 and 11.

Therefore, sharing the sense amplifier power line between the neighboring sense amplifiers can be prevented. As described above, sharing a current path may occur when the sense amplifier power line, to which the first and second sense amplifier voltage signals RTO and SB are transferred, is in a floating state, where the bit line sense amplifier is not driven. Furthermore, the sensing margin of the bit line sense amplifier can be secured by reducing leakage current caused in the sense amplifier power line when sharing a current path.

Figure 12:
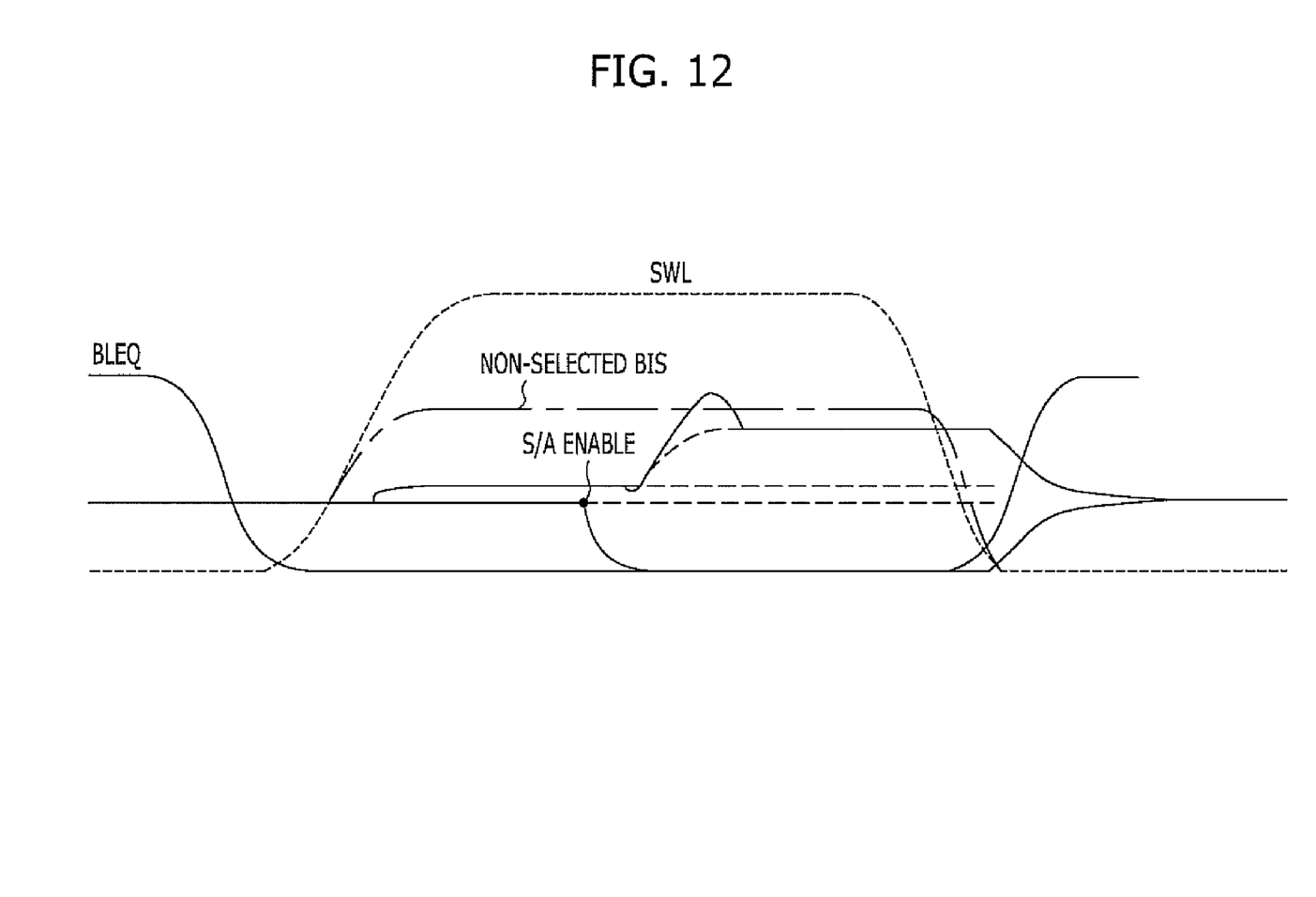
FIG. 12 is a waveform diagram illustrating an operation of the semiconductor memory device shown in FIG. 6.
Figure 13:
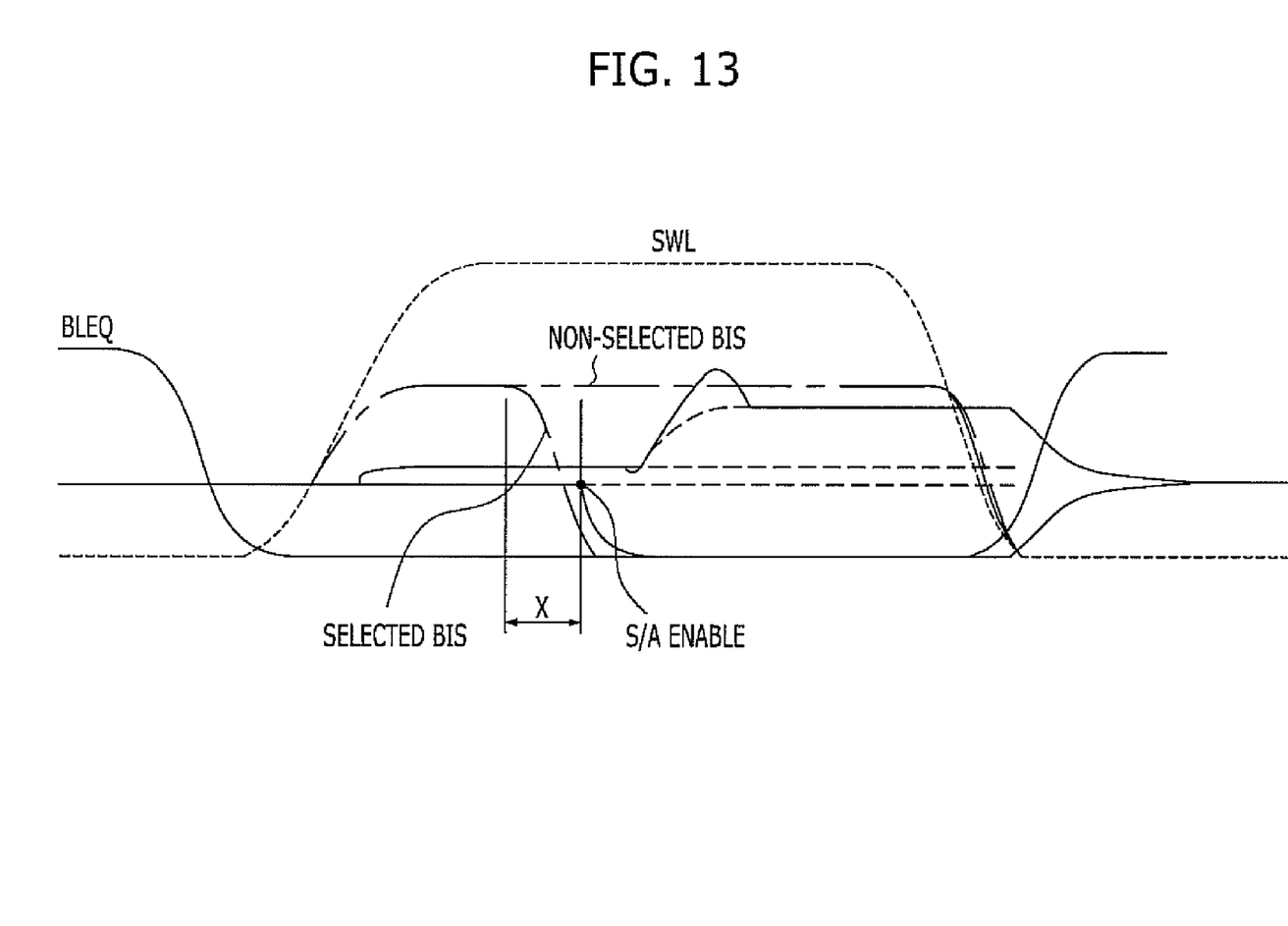
FIG. 13 is a waveform diagram illustrating an operation of the semiconductor memory device shown in FIG. 11

FIG. 12 is a waveform diagram illustrating an operation of the semiconductor memory device shown in FIG. 6. FIG. 13 is a waveform diagram illustrating an operation of the semiconductor memory device shown in FIG. 11.

Referring to FIG. 12, a charge sharing operation between the bit lines BL and BLB is performed by the selected bit line sense amplifier after the word line SWL is activated in the active mode. In this case, before the bit line sense amplifier is operated in the active mode, leakage current may occur in the sense amplifier power line to which the first and second sense amplifier voltage signals RTO and SB are transferred. Therefore, the operation margin of the bit line sense amplifier S/A may be reduced.

Referring to FIG. 13, the semiconductor memory device in accordance with an exemplary embodiment of the present invention may connect the bit lines of the cell array to the bit lines of the bit line sense amplifier unit in accordance with the driving timing of the bit line sense amplifier unit. In FIG. 13, a period X indicates the timing at which the bit line sense amplifier unit is driven after the bit lines of the cell array are connected to the bit lines of the bit line sense amplifier unit.

Furthermore, since the occurrence of leakage current in the sense amplifier power line to which the first and second sense amplifier voltage signals RTO and SB are transferred is prevented, the bit line sense amplifier unit may sense and amplify the signal applied to the bit lines with an optimal sensing margin.

In accordance with an exemplary embodiment of the present invention, the sensing margin of the sense amplifier may be improved, which improves operation characteristics of the semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a cell block comprising a first bit line;
   a sense amplifier unit comprising a second bit line and configured to amplify a data signal applied to the second bit line;
   a connection unit configured to selectively connect the first bit line and the second bit line;
   a connection control unit configured to receive a control signal for driving the sense amplifier unit and a selection signal for selecting the cell block, and generate a connection signal for activating the connection unit at a first time; and
   a sense amplifier driving control unit configured to receive the control signal, and generate a sense amplifier driving signal for driving the sense amplifier unit at a second time after the first time.

2. The semiconductor memory device of claim 1, wherein the second time is determined depending on a time at which the sense amplifier driving signal is transferred to the sense amplifier unit after the connection unit is activated by the connection signal.

3. The semiconductor memory device of claim 1, wherein the control signal comprises a first control signal and a second control signal, and
   the sense amplifier driving control unit comprises:
   a first driving controller configured to receive the first control signal and the selection signal and generate a first sense amplifier driving signal for providing a ground voltage to the sense amplifier unit; and
   a second driving controller configured to receive the second control signal and the selection signal and generate a second sense amplifier driving signal for providing a driving voltage to the sense amplifier unit.

4. The semiconductor memory device of claim 3, wherein the first driving controller comprises:
   a signal input section configured to combine the first control signal and the selection signal and generate an internal signal; and
   a delay transfer section configured to buffer the internal signal and output the buffered internal signal as the first driving signal.

5. The semiconductor memory device of claim 3, wherein the second driving controller comprises:
   a signal input section configured to combine the second control signal and the selection signal and generate an internal signal;
   a level shifter configured to shift a level of the internal signal; and
   a delay transfer section configured to buffer the level-shifted internal signal and output the buffered level-shifted internal signal as the second driving signal.

6. The semiconductor memory device of claim 1, wherein the connection control unit comprises:
   a signal input section configured to combine the control signal and the selection signal and generate an internal signal; and
   a level shifter configured to shift a level of the internal signal and output the connection signal.

7. A method for driving a semiconductor memory device comprising a cell block comprising a first bit line, and a sense amplifier unit comprising a second bit line and configured to amplify a data signal applied to the second bit line, the method comprising:
    selectively connecting the first bit line and the second bit line in response to a control signal for driving the sense amplifier unit and a selection signal for selecting the cell block at a first time; and
    generating a sense amplifier driving signal for driving the sense amplifier unit in response to the control signal at a second time after the first time.

8. The method of claim 7, wherein the second time is determined depending on a time at which the sense amplifier driving signal is transferred to the sense amplifier unit after the first time.

9. The method of claim 7, wherein the control signal comprises a first control signal and a second control signal, and
    the generating of the sense amplifier driving signal comprises:
        generating a first sense amplifier driving signal for providing a ground voltage to the sense amplifier unit in response to the first control signal and the selection signal; and
        generating a second sense amplifier driving signal for providing a driving voltage to the sense amplifier unit in response to the second control signal and the selection signal.

10. The method of claim 9, wherein the generating of the first sense amplifier driving signal comprises:
    generating an internal signal in response to the first control signal and the selection signal; and
    buffering the internal signal and outputting the buffered internal signal as the first sense amplifier driving signal.

11. The method of claim 9, wherein the generating of the second sense amplifier driving signal comprises:
    generating an internal signal in response to the second control signal and the selection signal;
    shifting a level of the internal signal; and
    buffering the level-shifted internal signal and outputting the buffered level-shifted internal signal as the second sense amplifier driving signal.

12. A semiconductor memory device comprising:
    a cell block having a first bit line and configured to store a data signal;
    a sense amplifying unit having a second bit line and configured to amplify the data signal in response to a driving signal;
    a connection unit configured to selectively connect the first bit line and the second bit line in response to a connection signal;
    a sense amplifying unit controller configured to generate the driving signal in response to a sense amplifying unit control signal; and
    a connection unit controller configured to generate the connection signal in response to the sense amplifying unit control signal and a selection signal for selecting the cell block,
    wherein the connection signal is synchronized with the driving signal.

\* \* \* \* \*